United States Patent
Mori (10) Patent No.: US 7,519,930 B2
(45) Date of Patent: Apr. 14, 2009

(54) METHOD OF CALCULATING A MODEL FORMULA FOR CIRCUIT SIMULATION

(75) Inventor: Kenji Mori, Kanagawa (JP)

(73) Assignees: Giga Hertz Technology Corp., Tokushima-shi (JP); System Mori Ltd., Yokohama-shi (JP)

( * ) Notice: Subject to any disclaimer, the term of this patent is extended or adjusted under 35 U.S.C. 154(b) by 156 days.

(21) Appl. No.: 11/512,331

(22) Filed: Aug. 30, 2006

(65) Prior Publication Data

US 2008/0059926 A1  Mar. 6, 2008

(51) Int. Cl.
*G06F 17/50* (2006.01)
*G06F 9/45* (2006.01)

(52) U.S. Cl. .................. 716/5; 716/1; 716/2; 716/3; 716/18; 703/2; 703/13; 703/14

(58) Field of Classification Search ............ 716/1–5, 716/18; 703/2, 13, 14
See application file for complete search history.

(56) References Cited

U.S. PATENT DOCUMENTS

| | | | | |
|---|---|---|---|---|
| 5,966,527 | A * | 10/1999 | Krivokapic et al. | 703/14 |
| 6,711,723 | B2 * | 3/2004 | Tsai et al. | 716/4 |
| 6,795,800 | B1 * | 9/2004 | Lee | 703/2 |
| 6,898,561 | B1 * | 5/2005 | Liu et al. | 703/14 |
| 2006/0107246 | A1 * | 5/2006 | Nakamura | 716/5 |

FOREIGN PATENT DOCUMENTS

JP  2005-235820  *  2/2005

OTHER PUBLICATIONS

Yang et al., S-TFT: An Analytical Model of Polysilicon Thin-Film Transistor for Circuit Simulation, 2000, IEEE, pp. 213-216.*

* cited by examiner

*Primary Examiner*—Jack Chiang
*Assistant Examiner*—Nghia M Doan
(74) *Attorney, Agent, or Firm*—Kratz, Quintos & Hanson, LLP

(57) ABSTRACT

A circuit simulator for a semiconductor device with reduced channel length includes a method of calculating a model formula for circuit simulation of a semiconductor device; calculating first parasitic resistance independent of gate voltage using actually measured device data; calculating second parasitic resistance dependent on the gate voltage using I-V characteristic of the device without the first parasitic resistance; dividing the second parasitic resistance into channel resistance and third parasitic resistance generated under both ends of a gate length using plural kinds of diffusion resistance TEG in which the width W of each kind of diffusion resistance is the same as each other, but the length L of each kind of diffusion resistance is different from the other kinds of diffusion resistance; and obtaining an I-V characteristic formula for the semiconductor device using the third parasitic resistance as an independent characteristic.

4 Claims, 10 Drawing Sheets

METHOD OF CALCULATING A MODEL FORMULA FOR CIRCUIT SIMULATION

CROSS-REFERENCE TO RELATED APPLICATION

This application relates to Japanese Patent Application No. 2004-39432 filed Feb. 17, 2004, which is hereby expressly incorporated by reference herein in its entirety.

BACKGROUND OF THE INVENTION

1. Field of the Invention

The present invention relates to a method of calculating a model formula for circuit simulation. In order to obtain high accuracy and high speed of a circuit simulator used in design of an integrated circuit, a model formula to be installed in the circuit simulator is obtained by extracting a model parameter by means of decomposition technique of actually measured data, and using the model parameter.

2. Description of the Prior Art

As conventional technique, a LEVEL1 model has been developed in Berkley campus, of California University in United State of America. Then, as a channel length becomes shorter, LEVEL2 and LEVEL3 models have been developed in the same university. A BSIM model, a BSIM2 model, a BSIM3 model and BSIM4 model have been developed continuously from the time when a channel length becomes less than 1 μm. Further, in industry, Fairchild Semiconductor developed a MOS9 model improved from the BSIM model. Moreover, recently, a HiSIM model is being developed in Hiroshima University in Japan.

The conventional models ignore parasitic resistance in order to speed up a circuit simulator. Further, in the case where it becomes a state where parasitic resistance cannot be ignored, a model formula in which the parasitic resistance is incorporated has been developed. However, since a model formula on the basis of physical phenomena which is obtained by decomposing actually measured data has not been developed, there is a problem that new models are to be developed in turn as a channel length becomes shorter. Further, in the case of a special process such as a high-pressure proof process, there is a problem that other model formula is developed in spite of having the same transistor structure.

SUMMARY OF THE INVENTION

It is an object of the present invention to obtain a model formula for a circuit simulator that can be applied to a semiconductor device in which a channel length thereof becomes further shorter.

In order to achieve the above object, the present invention is directed to a method of calculating a model formula for circuit simulation of a semiconductor device. The method of the present invention includes:

calculating first parasitic resistance independent of gate voltage using actually measured data of the semiconductor device;

calculating second parasitic resistance dependent on the gate voltage using IV characteristic of the semiconductor device from which the first parasitic resistance is removed;

dividing the second parasitic resistance into channel resistance and third parasitic resistance generated under both ends of a gate length using plural kinds of diffusion resistance TEG in which the width W of each kind of diffusion resistance is the same as each other, but the length L of each kind of diffusion resistance is different from the other kinds of diffusion resistance; and obtaining an I-V characteristic formula for the semiconductor device using the third parasitic resistance as an independent characteristic.

In the method of the present invention, as set forth in claim 2, it is preferable that the semiconductor device is a MOSFET, and that the method includes:

calculating the formula (1) as described blow from an $I'_{DS}$-$V_{GS}$ Characteristic from which parasitic resistance (2·$R_{CON}$+RD+RS) independent of the gate voltage, in the case where voltage between drain and source is defined as $V_{DS}$, current flowing a channel is defined as $I_{DS}$, resistance between the drain and the source is defined as $R_{OUT}$, contact resistance of a drain end and a source end is defined as $R_{CON}$, drain diffusion resistance is defined as RD, source diffusion resistance is defined as RS, LLD resistance under the gate is defined as $R_{LDD}$, and channel resistance under the gate is defined as $R_C$;

$$Rout = \frac{\{1 + \theta \cdot (V_{GS} - V_{TH})\}}{UO \cdot C_{OX} \cdot W_{eff} \cdot \left(V_{GS} - V_{TH} - \frac{1}{2} \cdot V'_{DS}\right)} \cdot \left\{(L - 2 \cdot LD) + \frac{\mu_S}{VMAX} \cdot V'_{DS}\right\} \quad (1)$$

calculating the formula (2) as described below from a formula ($R_{OUT}1 = 2 \cdot R_{LDD} + R_C 1 + RS$), a formula ($R_{OUT}2 = 2 \cdot R_{LDD} + R_C 2 + RS$), the $R_{out}$, $R_{OUT}1$ and $R_{OUT}2$, in the case where output resistance of a gate length L1 is defined as $R_{OUT}1$ and output resistance of a gate length L2 is defined as $R_{OUT}2$ as the diffusion resistance TEG; and $$\frac{Rout1 - Rout2}{L_1 - L_2} = \frac{\{1 + \theta \cdot (V_{GS} - V_{TH})\}}{UO \cdot C_{OX} \cdot W_{eff} \cdot \left(V_{GS} - V_{TH} - \frac{1}{2} \cdot V'_{DS}\right)} \quad (2)$$

determining the formula (3) as described below as the third parasitic resistance (2·$R_{LDD}$) generated under the both ends of the gate length L using the $R_{OUT}1$ and $R_{OUT}2$.

$$\frac{1}{C_{OX} \cdot W_{eff} \cdot \left(V_{GS} - V_{TH} - \frac{1}{2} \cdot V'_{DS}\right)} \cdot \frac{V'_{DS}}{VMAX} \quad (3)$$

Further, in the method of the present invention, as set forth in claim 3, it is preferable that the semiconductor device is a MOSFET, and that, in the case where voltage between drain and source is defined as $V_{DS}$, current flowing a channel is defined as $I_{DS}$, resistance between the drain and the source is defined as $R_{OUT}$, contact resistance of a drain end and a source end is defined as $R_{CON}$, drain diffusion resistance is defined as RD, source diffusion resistance is defined as RS, and X and Y axes are defined as $V_{DS}$ and $R_{OUT}$, the whole error is calculated using the formula (4) as described below from an error between line through a coordinate point (0, b) and a coordinate point (X, $Y_1$) provided higher voltage side than the $V_{DS}$ and coordinate points ($x_1$, $y_{11}$), ($x_2$, $y_{21}$) and Λ, and an error between line through a coordinate point (0, b) and a coordinate point $(X, Y_1)$ provided higher voltage side than the $V_{DS}$ and coordinate points $(x_1, y_{12})$, $(x_2, y_{22})$ and Λ (in the case where $(Y_1-b)$ in a certain coordinate point is a predetermined value or more, such a certain coordinate point is removed from the coordinate points), and "b" of the coordinate point (0, b) when the whole error becomes the smallest value is determined as parasitic resistance $(2 \cdot R_{CON}+RD+RS)$ independent of the gate voltage.

$$\sum_{j=1}^{m} \sum_{i=1}^{n} \left\{ y_{ij} - \left( \frac{Y_j - b}{X} \cdot x_i + b \right) \right\} \quad (4)$$

Moreover, in the method of the present invention, as set forth in claim 1, it is preferable that the semiconductor device includes a JFET, a BJT and a diode.

EFFECTS OF THE INVENTION

According to the present invention, it is possible to obtain a model parameter by decomposition of the actually measured data. Further, since a model formula is constructed from three kinds of resistance data by decomposing a region of resistance data into three regions, all gate lengths from long channel to short channel can be expressed by one model formula. It is no need to develop another model formula even in the case of a special process such as a high-pressure proof process. Further, the model formula of the present invention can be applied to process that will be developed in the future. In view of these points, the present invention is radically different from the conventional technique as described above.

BRIEF DESCRIPTION OF THE DRAWINGS

The foregoing and other objects, features and advantages of the present invention will become more readily apparent from the following detailed description of a preferred embodiment of the present invention given in conjunction with the accompanying drawings, in which.

DETAILED DESCRIPTION OF THE INVENTION

Preferred embodiments of a method of calculating a model formula for circuit simulation according to the present invention will now be described in detail with reference to the appending drawings.

Figure 1:
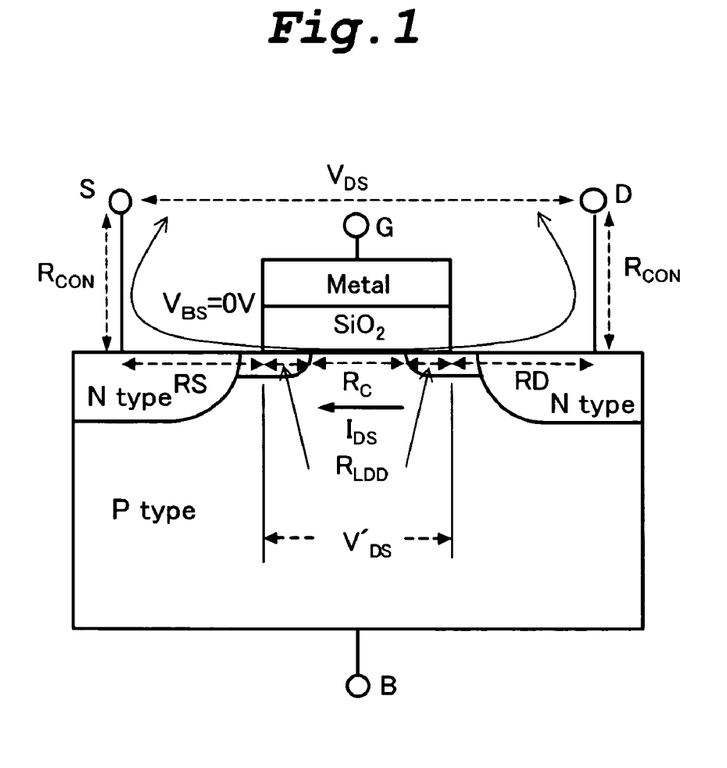
FIG. 1 is a structure view that shows a cross section of a MOSFET (Metal-Oxide Semiconductor Field-Effect Transistor) along a channel in an embodiment of the present invention.

FIG. 1 is a structure view that shows a cross section of a MOSFET (Metal-Oxide Semiconductor Field-Effect Transistor) along a channel.

As shown in FIG. 1, in the case where voltage between drain and source of the MOSFET is defined as $V_{DS}$, current flowing a channel is defined as $I_{DS}$, then resistance between the drain and the source becomes $R_{OUT}$. The $R_{OUT}$ is constituted from contact resistance $R_{CON}$ of a drain end and a source end, drain diffusion resistance RD, source diffusion resistance RS, parasitic resistance of LLD resistance $R_{LDD}$ under the gate, and channel resistance $R_C$ under the gate. Inner voltage $V'_{DS}$ that generates at both ends of the channel is a potential difference of the channel resistance $R_C$, and distinctly becomes a lower value by a voltage drop $(2 \cdot R_{CON}+RD+RS+2 \cdot R_{LDD}) \times I_{DS}$.

In view of FIG. 1, three following formulas are formed.

$$V_{DS} = Rout \cdot I_{DS} \quad (5)$$

$$Rout = 2 \cdot R_{CON}+RD+RS+2 \cdot R_{LDD}+R_C \quad (6)$$

$$V'_{DS} = (2 \cdot R_{LDD}+R_C) \cdot I_{DS} \quad (7)$$

Using a level 3 model in channel current formulas of the MOSFET, three following formulas can be expressed.

$$I_{DS} = \frac{W_{\it eff}}{L_{\it eff}} \cdot C_{OX} \cdot \frac{UO}{\{1+\theta \cdot (V_{GS}-V_{TH})\} \cdot \left\{1 + \frac{\mu_S}{L_{\it eff} \cdot VMAX} \cdot V'_{DS}\right\}} \cdot \left(V_{GS} - V_{TH} - \frac{1}{2} \cdot V'_{DS}\right) \quad (8)$$

$$L_{\it eff} = L - 2 \cdot LD \quad (9)$$

$$W_{\it eff} = W - 2 \cdot WD \quad (10)$$

Figure 2:
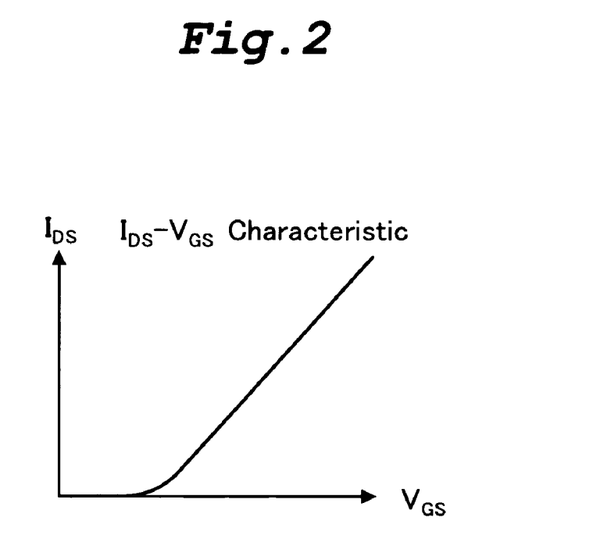
FIG. 2 is an $I_{DS}$-$V_{GS}$ Characteristic view of the MOSFET.
Figure 3:
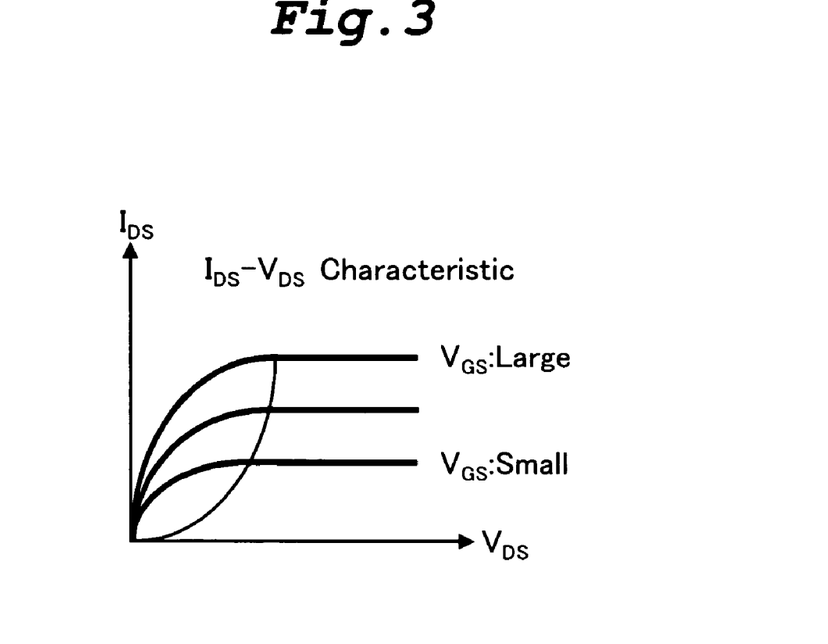
FIG. 3 is an $I_{DS}$-$V_{DS}$ Characteristic view of the MOSFET.
Figure 4:
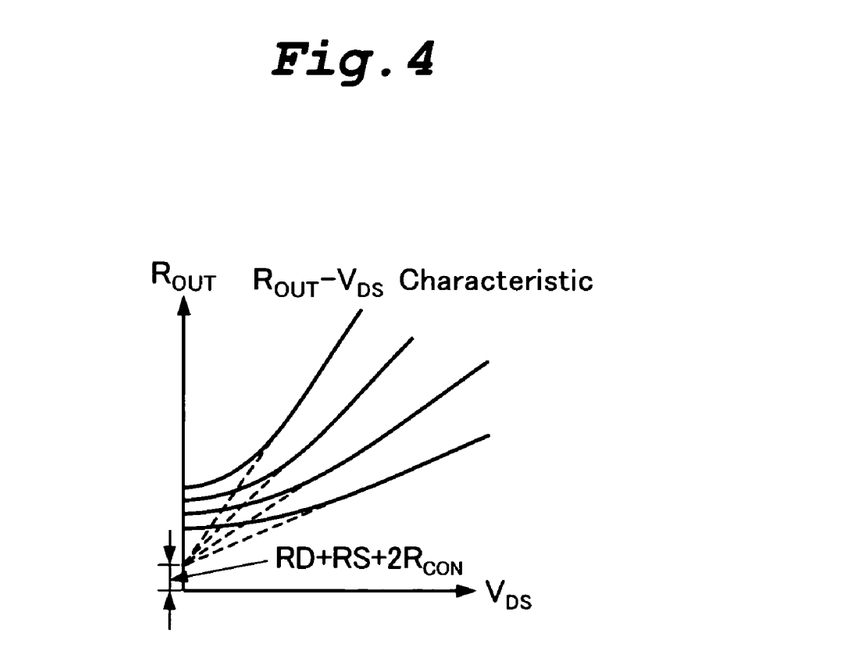
FIG. 4 is an $R_{OUT}$-$V_{DS}$ Characteristic view of the MOSFET that shows a general method of calculating parasitic resistance $(2 \cdot R_{CON}+RD+RS)$ independent of gate voltage.

FIG. 2 is an $I_{DS}$-$V_{GS}$ Characteristic view of the MOSFET.
FIG. 3 is an $I_{DS}$-$V_{DS}$ Characteristic view of the MOSFET.
FIG. 4 shows a method of calculating parasitic resistance $(2 \cdot R_{CON}+RD+RS)$ independent of gate voltage from an $R_{OUT}$-$V_{DS}$ Characteristic view by obtaining the $R_{OUT}$-$V_{DS}$ Characteristic from the $I_{DS}$-$V_{DS}$ Characteristic of the MOSFET shown in FIG. 3. Namely, the gate current $I_{DS}$ of the MOSFET becomes lower due to the parasitic resistance $(2 \cdot R_{CON}+RD+RS)$ independent of gate voltage. Thus, from $R_{OUT}$-$V_{DS}$ Characteristic views of a plurality of MOSFETs, parasitic resistance ($2 \cdot R_{CON}$+RD+RS) independent of gate voltage that is common to all of the plurality of MOSFETs is obtained.

A formula (11) is obtained from the formulas (7) and (8).

$$2 \cdot R_{LDD} + R_C = \frac{V'_{DS}}{I_{DS}} = \frac{\{1 + \theta \cdot (V_{GS} - V_{TH})\} \cdot \left\{1 + \frac{\mu_S}{L_{eff} \cdot VMAX} \cdot V'_{DS}\right\}}{UO \cdot C_{OX} \cdot \frac{W_{eff}}{L_{eff}} \cdot \left(V_{GS} - V_{TH} - \frac{1}{2} \cdot V'_{DS}\right)} \quad (11)$$

When the formula (11) is assigned to the formula (6), a formula (12) is obtained.

$$R_{out} = 2 \cdot R_{CON} + RD + RS + \frac{\{1 + \theta \cdot (V_{GS} - V_{TH})\} \cdot \left\{1 + \frac{\mu_S}{L_{eff} \cdot VMAX} \cdot V'_{DS}\right\}}{UO \cdot C_{OX} \cdot \frac{W_{eff}}{L_{eff}} \cdot \left(V_{GS} - V_{TH} - \frac{1}{2} \cdot V'_{DS}\right)} \quad (12)$$

From the formula (12), a term of $R_C$ becomes a straight line in which slope of resistance changes due to the gate voltage $V_{GS}$, and its intersection point becomes the parasitic resistance ($2 \cdot R_{CON}$+RD+RS) independent of gate voltage.

Figure 5:
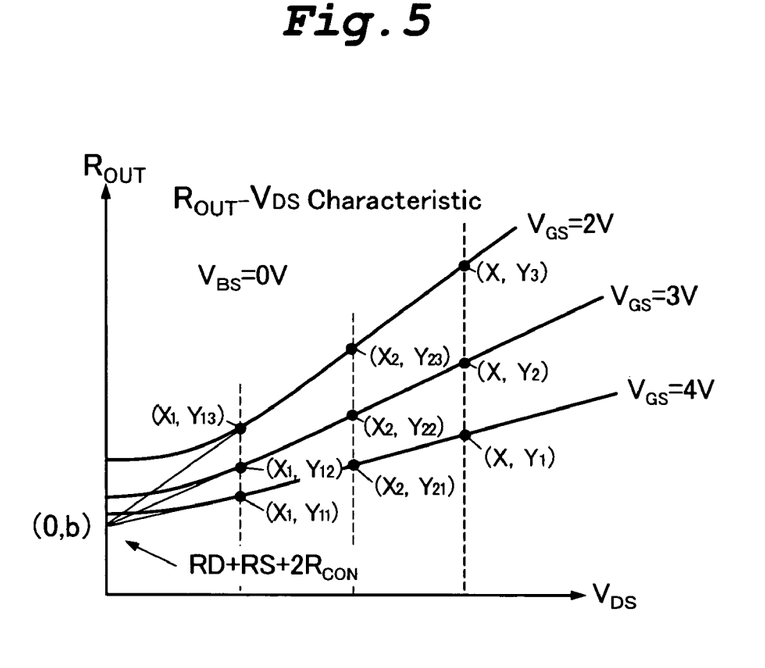
FIG. 5 is an $R_{OUT}$-$V_{DS}$ Characteristic view of the MOSFET that shows a concrete method of calculating parasitic resistance $(2 \cdot R_{CON}+RD+RS)$ independent of gate voltage.

FIG. 5 is a characteristic view in one embodiment of the present invention, and is used for concretely explaining a method of calculating the parasitic resistance ($2 \cdot R_{CON}$+RD+RS) independent of gate voltage as shown in FIG. 4.

First, in the case where coordinates at which three straight lines intersect at one point is defined as (0, b), and coordinates at a high voltage side of the $V_{DS}$ voltage is defined as (X, $Y_1$), then a straight line passing through the two points is expressed as a formula (13).

$$y = \frac{Y_1 - b}{X} \cdot x + b \quad (13)$$

When an error between this straight line and each of coordinates ($x_1$, $y_{11}$) and ($x_2$, $y_{21}$), and $\Lambda$ is calculated, an error between the straight line and the coordinates ($x_1$, $y_{11}$) is expressed as a formula (14).

$$y_{11} - \left(\frac{Y_1 - b}{X} \cdot x_1 + b\right) \quad (14)$$

At this time, in the case where (relative error)=error/($Y_1$-b)≧0.001, the coordinates are removed. Further, an error between the straight line and the coordinates ($x_2$, $y_{21}$) is expressed as a formula (15).

$$y_{21} - \left(\frac{Y_1 - b}{X} \cdot x_2 + b\right) \quad (15)$$

At this time, in the case where (relative error)=error/($Y_1$-b)≧0.001, the coordinates are removed. Hereinafter, the same operation is repeated.

An error is normally expressed as a formula (16).

$$\sum_{i=1}^{n}\left\{y_{i1} - \left(\frac{Y_1 - b}{X} \cdot x_i + b\right)\right\} \quad (16)$$

Next, in the case where coordinates at which three straight lines intersect at one point is defined as (0, b), and coordinates at a high voltage side of the $V_{DS}$ voltage is defined as (X, $Y_2$), then a straight line passing through the two points is expressed as a formula (17).

$$y = \frac{Y_2 - b}{X} \cdot x + b \quad (17)$$

When an error between this straight line and each of coordinates ($x_1$, $y_{12}$) and ($x_2$, $y_{22}$), and $\Lambda$ is calculated, an error between the straight line and the coordinates ($x_1$, $y_{12}$) is expressed as a formula (18).

$$y_{12} - \left(\frac{Y_2 - b}{X} \cdot x_1 + b\right) \quad (18)$$

At this time, in the case where (relative error)=error/($Y_1$-b)≧0.001, the coordinates are removed. Further, an error between the straight line and the coordinates ($x_2$, $y_{22}$) is expressed as a formula (19).

$$y_{22} - \left(\frac{Y_2 - b}{X} \cdot x_2 + b\right) \quad (19)$$

At this time, in the case where (relative error)=error/($Y_1$-b)≧0.001, the coordinates are removed. Hereinafter, the same operation is repeated.

An error is normally expressed as a formula (20).

$$\sum_{i=1}^{n}\left\{y_{i2} - \left(\frac{Y_2 - b}{X} \cdot x_i + b\right)\right\} \quad (20)$$

Thus, the entire errors are expressed as a following formula (21).

$$\sum_{j=1}^{m}\sum_{i=1}^{n}\left\{y_{ij} - \left(\frac{Y_j - b}{X} \cdot x_i + b\right)\right\} \quad (21)$$

A value "b" of the coordinates (0, b) at which the entire errors become smallest is the parasitic resistance ($2 \cdot R_{CON}$+RD+RS) independent of gate voltage.

Namely, an I-V characteristic from which the parasitic resistance independent of gate voltage is removed is obtained as follows.

First, $R_{OUT}$ is calculated using $R_{OUT}=V_{DS}/I_{DS}$.

Next, $2 \cdot R_{LDD}+R_C$ is calculated using $2 \cdot R_{LDD}+R_C=R_{OUT}-(2 \cdot R_{CON}+RD+RS)$.

Further, I'$_{DS}$ is recalculated using a following formula (22).

$$I'_{DS} = \frac{V'_{DS}}{2 \cdot R_{LDD} + R_C} = KP \cdot \frac{Weff}{Leff} \cdot (V_{GS} - V_{TH}) \cdot V'_{DS} \quad (22)$$

Here, parasitic resistance independent of gate voltage becomes (2·R$_{CON}$+RD+RS), while parasitic resistance dependent upon gate voltage becomes (2·R$_{LDD}$+R$_C$).

Figure 6:
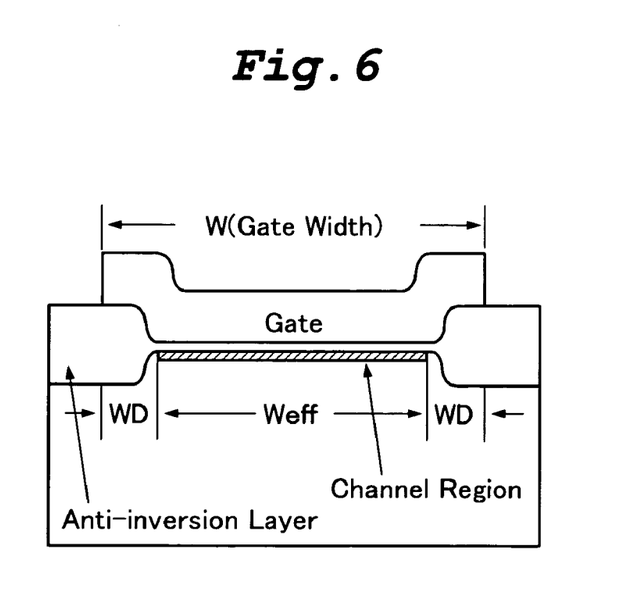
FIG. 6 is a configuration view that shows a cross section of the MOSFET perpendicular to the channel.

FIG. 6 is a configuration view that shows a cross section of the MOSFET perpendicular to the channel. As shown in FIG. 6, a cross-sectional diffusion length (WD) of the MOSFET is a length of an anti-inversion layer that gets into under a gate width W, and a channel width obtained by subtracting the cross-sectional diffusion lengths (2 WD) of the MOSFET generated at both sides of the gate width from the gate width W is an effective channel width W$_{eff}$. It is important to consider the WD because an error between a measured value and simulated value is made smaller.

Figure 7:
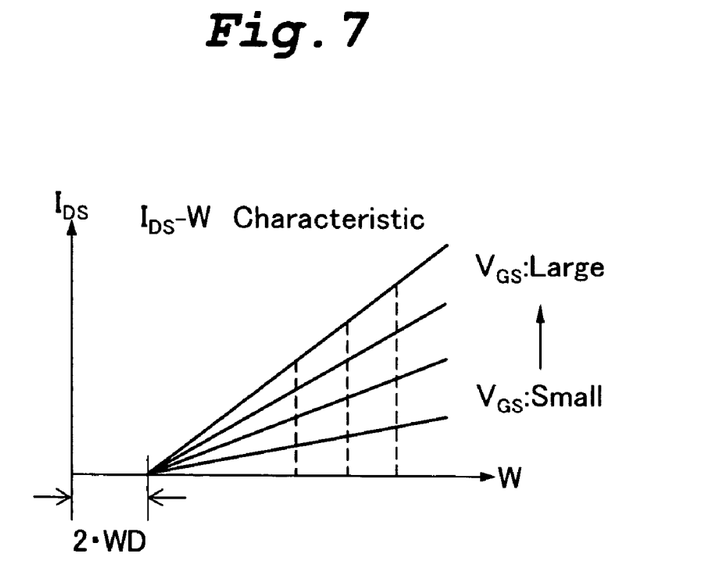
FIG. 7 is an $I_{DS}$-W Characteristic view that shows a general method of obtaining 2 WD.

FIG. 7 is an I$_{DS}$-W Characteristic view that shows a method of obtaining 2 WD. Drain current I$_{DS}$ of the MOSFET becomes smaller due to the 2 WD. Thus, from I'$_{DS}$-V$_{GS}$ Characteristic views of a plurality of MOSFETs from each of which parasitic resistance independent of gate voltage is removed, the cross-sectional diffusion lengths (2 WD) of the MOSFET generated at both sides of the gate width W as shown in FIG. 3 is obtained.

When the formula (9) is assigned to the formula (8), a formula (23) is, obtained.

$$I_{DS} = \frac{W - 2 \cdot WD}{L_{eff}} \cdot C_{OX} \cdot \frac{UO}{\{1 + \theta \cdot (V_{GS} - V_{TH})\} \cdot \left\{1 + \frac{\mu_S}{L_{eff} \cdot VMAX} \cdot V'_{DS}\right\}} \cdot \left(V_{GS} - V_{TH} - \frac{1}{2} \cdot V'_{DS}\right) \cdot V'_{DS} \quad (23)$$

From the formula (23), using a plurality of MOSFETs in which gate lengths L of the MOSFETS are the same as each other and gate widths W of the MOSFETs are different from each other, as shown in FIG. 7, by respectively defining the drain current I$_{DS}$ and the gate width W as a Y axis and an X axis, it is possible to obtain 2·WD from an intersection point between the X axis and a straight line in which points of the same gate voltage V$_{GS}$ are connected.

Figure 8:
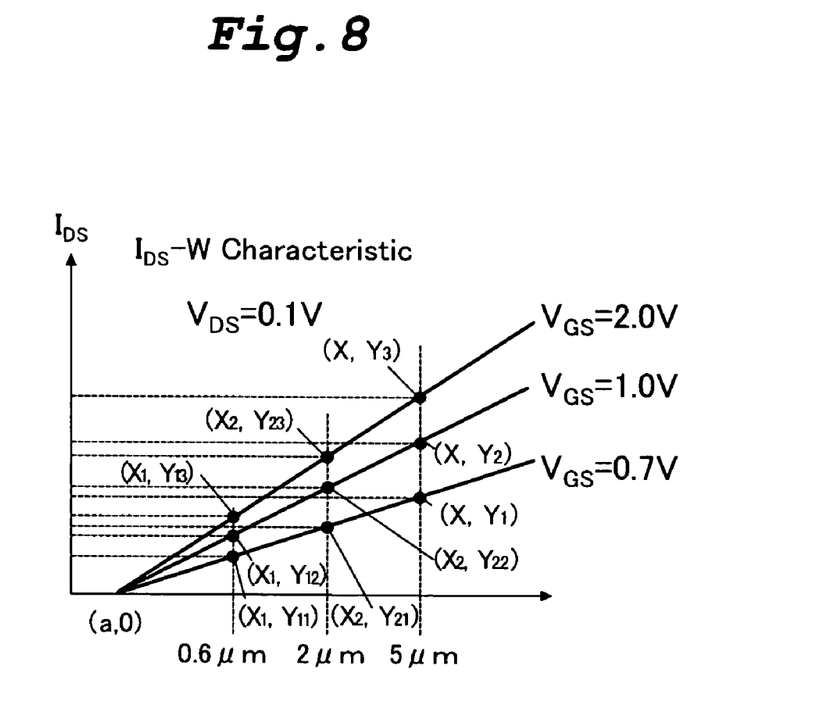
FIG. 8 is an $I_{DS}$-W Characteristic view that shows a concrete method of obtaining 2 WD.

FIG. 8 is a characteristic view in one embodiment of the present invention, and is used for explaining a concrete method of obtaining a cross-section diffusion length (2 WD) of the MOSFET generated at both ends of a gate width W by generating an I'$_{DS}$-W Characteristic using an I'$_{DS}$-V$_{GS}$ Characteristic from which parasitic resistance independent of gate voltage is removed.

First, in the case where coordinates at which three straight lines intersect at one point is defined as (a, 0), and coordinates of a long width is defined as (X, Y$_1$), then a straight line passing through the two points is expressed as a formula (24).

$$y = \frac{Y_1}{X - a} \cdot (x - a) \quad (24)$$

When an error between this straight line and each of coordinates (x$_1$, y$_{11}$) and (x$_2$, y$_{21}$), and Λ is calculated, an error between the straight line and the coordinates (x$_1$, y$_{11}$) is expressed as a formula (25).

$$y_{11} - \frac{Y_1}{X - a} \cdot (x_1 - a) \quad (25)$$

An error between the straight line and the coordinates (x$_2$, y$_{21}$) is expressed as a formula (26).

$$y_{21} - \frac{Y_1}{X - a} \cdot (x_2 - a) \quad (26)$$

Hereinafter, the same operation is repeated.

An error is normally expressed as a formula (27).

$$\sum_{i=1}^{n} \left\{ y_{i1} - \frac{Y_1}{X - a} \cdot (x_i - a) \right\} \quad (27)$$

Next, in the case where coordinates at which three straight lines intersect at one point is defined as (a, 0), and coordinates of the long width is defined as (X, Y$_2$), then a straight line passing through the two points is expressed as a formula (28).

$$y = \frac{Y_2}{X - a} \cdot (x - a) \quad (28)$$

When an error between this straight line and each of coordinates (x$_1$, y$_{12}$) and (x$_2$, y$_{22}$), and Λ is calculated, an error between the straight line and the coordinates (x$_1$, y$_{12}$) is expressed as a formula (29).

$$y_{12} - \frac{Y_2}{X - a} \cdot (x_1 - a) \quad (29)$$

An error between the straight line and the coordinates (x$_2$, y$_{21}$) is expressed as a formula (30).

$$y_{22} - \frac{Y_2}{X - a} \cdot (x_2 - a) \quad (30)$$

Hereinafter, the same operation is repeated.

An error is normally expressed as a formula (31).

$$\sum_{i=1}^{n} \left\{ y_{i2} - \frac{Y_2}{X - a} \cdot (x_i - a) \right\} \quad (31)$$

Thus, the entire errors are expressed as a following formula (32).

$$\sum_{j=1}^{m}\sum_{i=1}^{n}\left\{y_{ij} - \frac{Y_j}{X-a} \cdot (x_i - a)\right\} \tag{32}$$

A value "a" of the coordinates (a, 0) at which the entire errors become smallest is the cross-sectional diffusion lengths (2 WD) of the MOSFET generated at both ends of the gate width W.

Figure 9:
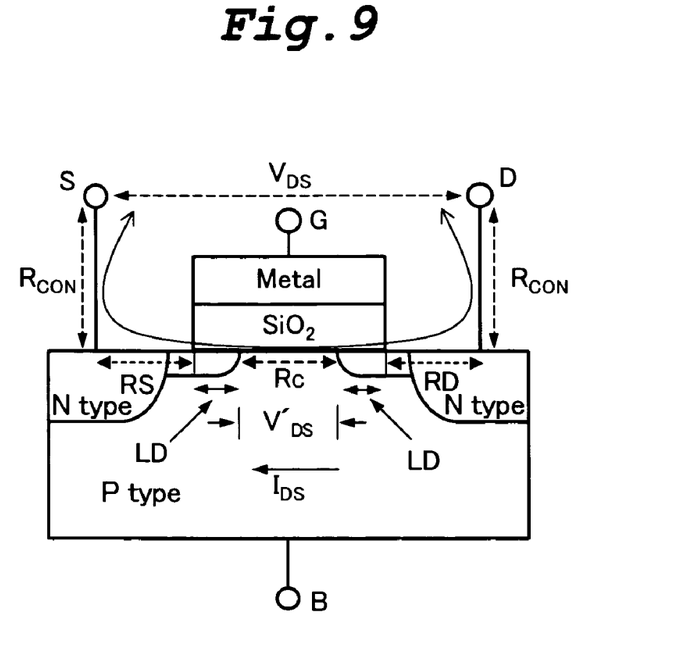
FIG. 9 is a drawing for explaining a method of obtaining the length of parasitic resistance (2 LD) generated under both ends of a gate length L from an $I'_{DS}$-$V_{GS}$ characteristic from which parasitic resistance independent on the gate voltage is removed.

FIG. 9 is a characteristic view in one embodiment of the present invention, and is a drawing for explaining a method of obtaining the length of parasitic resistance (2 LD) generated under both ends of a gate length L by generating an $R_{OUT}$-L characteristic from which parasitic resistance independent on the gate voltage is removed.

By removing the parasitic resistance (2·$R_{CON}$+RD+RS) independent of gate voltage from the formula (12), a formula (33) is obtained.

$$R_{out} = \frac{\{1 + \theta \cdot (V_{GS} - V_{TH})\} \cdot \left\{1 + \frac{\mu_S}{L_{eff} \cdot VMAX} \cdot V'_{DS}\right\}}{UO \cdot C_{OX} \cdot W_{eff} \cdot \left(V_{GS} - V_{TH} - \frac{1}{2} \cdot V'_{DS}\right)} \cdot (L - 2 \cdot LD) \tag{33}$$

Figure 10:
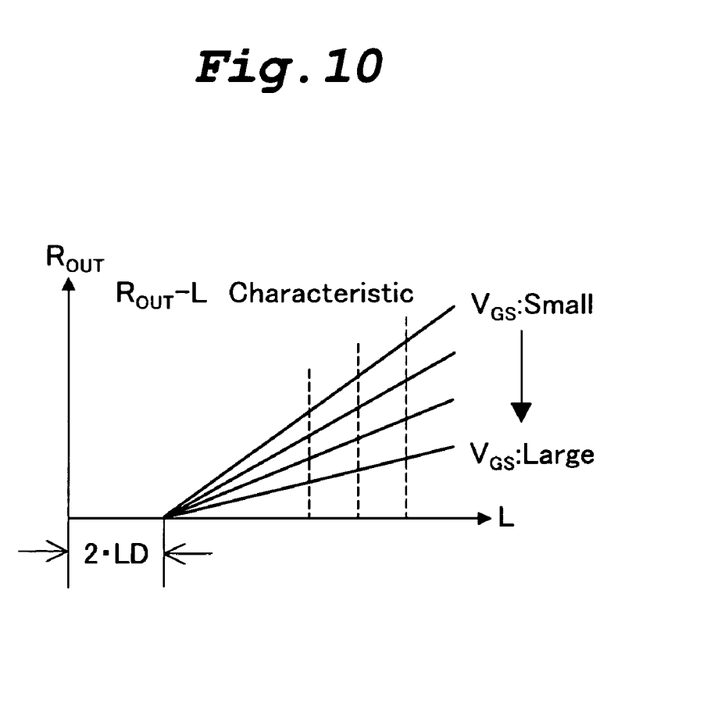
FIG. 10 is an $R_{OUT}$-L characteristic view that shows a general method of obtaining 2 LD.

From the formula (33), using a plurality of TEGs in which gate widths W of the MOSFETS are the same as each other and gate lengths L of the MOSFETs are different from each other, as shown in FIG. 10, by respectively defining external resistance $R_{OUT}$ and the gate length L as a Y axis and an X axis, it is possible to obtain 2·LD from an intersection point between the X axis and a straight line in which points of the same gate voltage $V_{GS}$ are connected.

Figure 11:
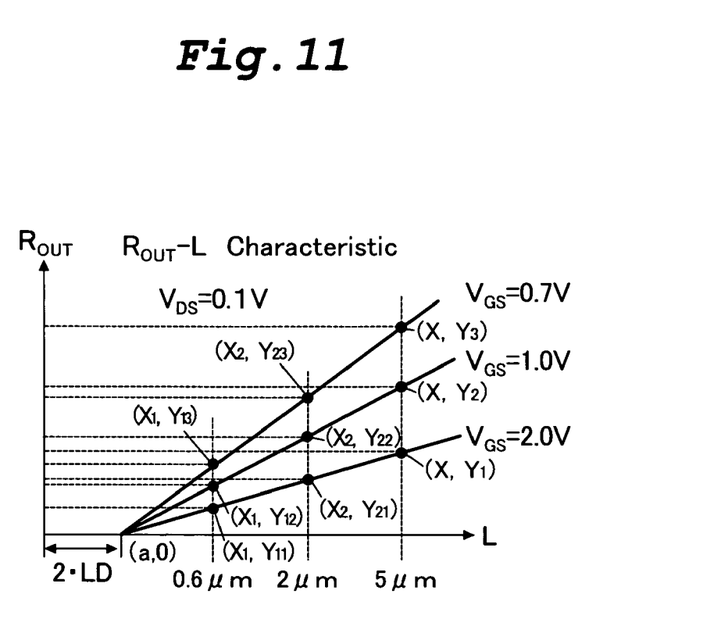
FIG. 11 is an $R_{OUT}$-L characteristic view that shows a concrete method of obtaining 2 LD.

FIG. 11 is a characteristic view in one embodiment of the present invention, and is used for explaining a concrete method of obtaining a length of the parasitic resistance (2 LD) generated under both ends of the gate length L using an I'$_{DS}$-V$_{GS}$ characteristic from which parasitic resistance independent on the gate voltage is removed.

First, in the case where coordinates at which three straight lines intersect at one point is defined as (a, 0), and coordinates of a long length is defined as (X, Y$_1$), then a straight line passing through the two points is expressed as a formula (34).

$$y = \frac{Y_1}{X-a} \cdot (x-a) \tag{34}$$

When an error between this straight line and each of coordinates ($x_1$, $y_{11}$) and ($x_2$, $y_{21}$), and Λ is calculated, an error between the straight line and the coordinates ($x_1$, $y_{11}$) is expressed as a formula (35).

$$y_{11} - \frac{Y_1}{X-a} \cdot (x_1 - a) \tag{35}$$

Further, an error between the straight line and the coordinates ($x_2$, $y_{21}$) is expressed as a formula (36).

$$y_{21} - \frac{Y_1}{X-a} \cdot (x_2 - a) \tag{36}$$

Hereinafter, the same operation is repeated.
An error is normally expressed as a formula (37).

$$\sum_{i=1}^{n}\left\{y_{i1} - \frac{Y_1}{X-a} \cdot (x_i - a)\right\} \tag{37}$$

Next, in the case where coordinates at which three straight lines intersect at one point is defined as (a, 0), and coordinates of the long length is defined as (X, Y$_2$), then a straight line passing through the two points is expressed as a formula (38).

$$y = \frac{Y_2}{X-a} \cdot (x-a) \tag{38}$$

When an error between this straight line and each of coordinates ($x_1$, $y_{12}$) and ($x_2$, $y_{22}$), and Λ is calculated, an error between the straight line and the coordinates ($x_1$, $y_{12}$) is expressed as a formula (39).

$$y_{12} - \frac{Y_2}{X-a} \cdot (x_1 - a) \tag{39}$$

An error between the straight line and the coordinates ($x_2$, $y_{21}$) is expressed as a formula (40).

$$y_{22} - \frac{Y_2}{X-a} \cdot (x_2 - a) \tag{40}$$

Hereinafter, the same operation is repeated.
An error is normally expressed as a formula (41).

$$\sum_{i=1}^{n}\left\{y_{i2} - \frac{Y_2}{X-a} \cdot (x_i - a)\right\} \tag{41}$$

Thus, the entire errors are expressed as a following formula (42).

$$\sum_{j=1}^{m}\sum_{i=1}^{n}\left\{y_{ij} - \frac{Y_j}{X-a} \cdot (x_i - a)\right\} \tag{42}$$

A value "a" of the coordinates (a, 0) at which the entire errors become smallest is the length (2 WD) of the parasitic resistance generated under both ends of the gate length L.

FIG. 12 is a drawing for explaining a basic principle of obtaining parasitic resistance (2·$R_{LDD}$) generated under both ends of the gate length L. Contact resistance $R_{CON}$ always exists in the diffusion resistance TEG. For this reason, when measuring diffusion resistance by one TEG, resistance including contact resistance $R_{CON}$ is obtained. Thus, by using two types of diffusion resistance TEGs in which widths W of the diffusion resistance are the same as each other and lengths L thereof are different from each other, it is possible to separate the contact resistance ($R_{CON}$) from the diffusion resistance (RD or RS).

Figure 12A:
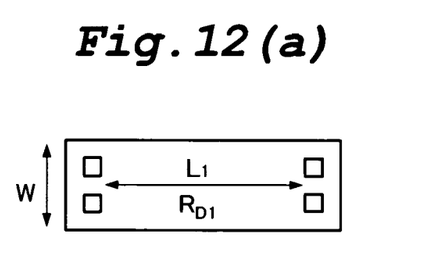
FIG. 12 is a drawing for explaining a basic principle of obtaining parasitic resistance $(2 \cdot R_{LDD})$ generated under both ends of the gate length L.

From FIG. 12(a), output resistance ($R_{OUT}1$) is as follows.

$$\text{Rout1} = 2 \cdot R_{CON} + R_{D1} \tag{43}$$

Figure 12B:
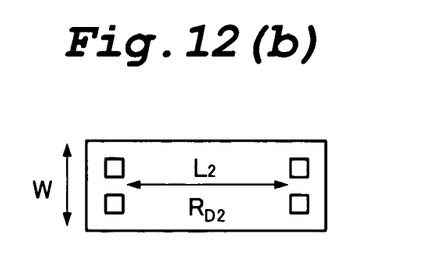

From FIG. 12(b), output resistance ($R_{OUT}2$) is as follows.

$$\text{Rout2} = 2 \cdot R_{CON} + R_{D2} \tag{44}$$

When the diffusion resistance is expressed using diffusion sheet resistance $R_{SH}$, formulas (43) and (44) are respectively rewritten as following formulas (45) and (46).

$$\begin{aligned} \text{Rout1} &= 2 \cdot R_{CON} + \sigma \cdot \frac{l_1}{d \times w} \\ &= 2 \cdot R_{CON} + \frac{\sigma}{d} \times \frac{l_1}{w} \\ &= 2 \cdot R_{CON} + R_{SH} \times \frac{l_1}{w} \end{aligned} \tag{45}$$

$$\begin{aligned} \text{Rout2} &= 2 \cdot R_{CON} + \sigma \cdot \frac{l_2}{d \times w} \\ &= 2 \cdot R_{CON} + \frac{\sigma}{d} \times \frac{l_2}{w} \\ &= 2 \cdot R_{CON} + R_{SH} \times \frac{l_2}{w} \end{aligned} \tag{46}$$

When contact resistance ($R_{CON}$) is removed from each of the formulas (45) and (46), the diffusion sheet resistance ($R_{SH}$) is obtained.

$$R_{SH} = w \times \frac{\text{Rout1} - \text{Rout2}}{l_1 - l_2} \tag{47}$$

When the formula (47) is assigned to the formula (45), the contact resistance ($R_{CON}$) is obtained.

$$R_{CON} = \frac{1}{2} \cdot \frac{l_1 \cdot \text{Rout2} - l_2 \cdot \text{Rout1}}{l_1 - l_2} \tag{48}$$

When the formulas (47) and (48) are respectively assigned to the formulas (45) and (46), formulas (49) and (50) are obtained.

$$R_{D1} = \frac{\text{Rout1} - \text{Rout2}}{l_1 - l_2} \cdot l_1 \tag{49}$$

$$R_{D2} = \frac{\text{Rout1} - \text{Rout2}}{l_1 - l_2} \cdot l_2 \tag{50}$$

FIG. 13 is a drawing for explaining separation of channel resistance ($R_C$) and the parasitic resistance ($2 \cdot R_{LDD}$) generated under both ends of the gate length L. By applying the method as explained in FIG. 12 into practice, it is possible to separate the channel resistance ($R_C$) from the parasitic resistance ($2 \cdot R_{LDD}$) generated under both ends of the gate length L.

From FIG. 13(a), output resistance ($R_{OUT}1$) is as follows.

$$\text{Rout1} = 2 \cdot R_{LDD} + R_{C1} \tag{51}$$

From FIG. 13(b), output resistance ($R_{OUT}2$) is as follows.

$$\text{Rout2} = 2 \cdot R_{LDD} + R_{C2} \tag{52}$$

When the formula (33) is simplified, a formula (53) is obtained.

$$\text{Rout} = \frac{\{1 + \theta \cdot (V_{GS} - V_{TH})\}}{UO \cdot C_{OX} \cdot W_{\text{eff}} \cdot \left(V_{GS} - V_{TH} - \frac{1}{2} \cdot V'_{DS}\right)} \cdot \left\{(L - 2 \cdot LD) + \frac{\mu_S}{V\text{MAX}} \cdot V'_{DS}\right\} \tag{53}$$

Figure 13A:
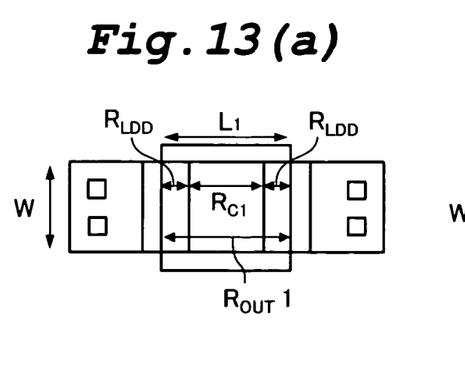
FIG. 13 is a drawing for explaining separation of channel resistance $(R_C)$ and the parasitic resistance $(2 \cdot R_{LDD})$ generated under both ends of the gate length L.

When the output resistance ($R_{OUT}1$) of FIG. 13(a) is expressed using the formula (53), a formula (54) is obtained.

$$\text{Rout1} = \frac{\{1 + \theta \cdot (V_{GS} - V_{TH})\}}{UO \cdot C_{OX} \cdot W_{\text{eff}} \cdot \left(V_{GS} - V_{TH} - \frac{1}{2} \cdot V'_{DS}\right)} \cdot \left\{(L_1 - 2 \cdot LD) + \frac{\mu_S}{V\text{MAX}} \cdot V'_{DS}\right\} \tag{54}$$

Figure 13B:
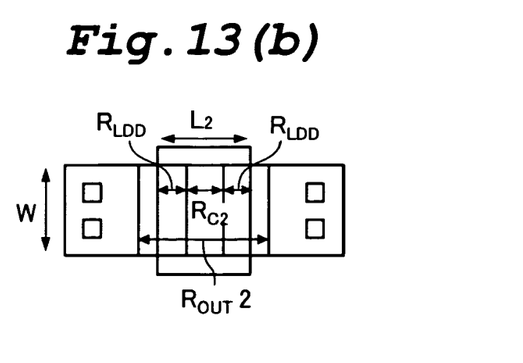

When the output resistance ($R_{OUT}2$) of FIG. 13(b) is expressed using the formula (53), a formula (55) is obtained.

$$\text{Rout2} = \frac{\{1 + \theta \cdot (V_{GS} - V_{TH})\}}{UO \cdot C_{OX} \cdot W_{\text{eff}} \cdot \left(V_{GS} - V_{TH} - \frac{1}{2} \cdot V'_{DS}\right)} \cdot \left\{(L_2 - 2 \cdot LD) + \frac{\mu_S}{V\text{MAX}} \cdot V'_{DS}\right\} \tag{55}$$

A formula (56) is obtained from the formulas (54) and (55).

$$\frac{\text{Rout1} - \text{Rout2}}{L_1 - L_2} = \frac{\{1 + \theta \cdot (V_{GS} - V_{TH})\}}{UO \cdot C_{OX} \cdot W_{\text{eff}} \cdot \left(V_{GS} - V_{TH} - \frac{1}{2} \cdot V'_{DS}\right)} \tag{56}$$

From FIG. 13(a), a formula (57) is obtained.

$$\begin{aligned} R_{C1} &= (L_1 - 2 \cdot LD) \cdot \frac{\text{Rout1} - \text{Rout2}}{L_1 - L_2} \\ &= \frac{\{1 + \theta \cdot (V_{GS} - V_{TH})\}}{UO \cdot C_{OX} \cdot W_{\text{eff}} \cdot \left(V_{GS} - V_{TH} - \frac{1}{2} \cdot V'_{DS}\right)} \cdot (L_1 - 2LD) \end{aligned} \tag{57}$$

From FIG. 13(b), a formula (58) is obtained.

$$\begin{aligned} R_{C2} &= (L_2 - 2 \cdot LD) \cdot \frac{\text{Rout1} - \text{Rout2}}{L_1 - L_2} \\ &= \frac{\{1 + \theta \cdot (V_{GS} - V_{TH})\}}{UO \cdot C_{OX} \cdot W_{\text{eff}} \cdot \left(V_{GS} - V_{TH} - \frac{1}{2} \cdot V'_{DS}\right)} \cdot (L_2 - 2LD) \end{aligned} \tag{58}$$

From the formulas (57) and (58), the cannel resistance ($R_C$) is expressed as a following formula (59).

$$R_C = \frac{\{1 + \theta \cdot (V_{GS} - V_{TH})\}}{UO \cdot C_{OX} \cdot W_{\text{eff}} \cdot \left(V_{GS} - V_{TH} - \frac{1}{2} \cdot V'_{DS}\right)} \cdot (L - 2 \cdot LD) \tag{59}$$

When the formulas (57) and (58) are respectively assigned to the formulas (54) and (55), the parasitic resistance (2·$R_{LDD}$) generated under the both sides of the gate length L is expressed as a following formula (60).

$$2 \cdot R_{LDD} = \frac{\{1 + \theta \cdot (V_{GS} - V_{TH})\}}{UO \cdot C_{OX} \cdot W_{eff} \cdot \left(V_{GS} - V_{TH} - \frac{1}{2} \cdot V'_{DS}\right)} \cdot \frac{\mu_S}{VMAX} \cdot V'_{DS}$$

$$= \frac{1}{C_{OX} \cdot W_{eff} \cdot \left(V_{GS} - V_{TH} - \frac{1}{2} \cdot V'_{DS}\right)} \cdot \frac{V'_{DS}}{VMax} \quad (60)$$

Here, in the formula (60), it can be considered that 2·$R_{LDD}$ is sheet resistance ($R_{SHLDD}$) that is inversely proportional to $W_{eff}\cdot(V_{GS}-V_{TH}-½\cdot V'_{DS})$ and proportional to 2·LD. When this is expressed as a formula, a formula (61) is obtained.

$$2 \cdot R_{LDD} = \frac{2 \cdot LD \cdot R_{SHLDD}}{W_{eff} \cdot \left(V_{GS} - V_{TH} - \frac{1}{2} \cdot V'_{DS}\right)} \quad (61)$$

When the formula (59) is combined with the formula (61), a formula (62) is obtained.

$$Rout = 2 \cdot R_{LDD} + R_C \quad (62)$$

$$= \frac{\{1 + \theta \cdot (V_{GS} - V_{TH})\}}{UO \cdot C_{OX} \cdot W_{eff} \cdot \left(V_{GS} - V_{TH} - \frac{1}{2} \cdot V'_{DS}\right)} \cdot (L - 2 \cdot LD) + \frac{2 \cdot LD \cdot R_{SHLDD}}{W_{eff} \cdot \left(V_{GS} - V_{TH} - \frac{1}{2} \cdot V'_{DS}\right)}$$

$$= \frac{\frac{\{1 + \theta \cdot (V_{GS} - V_{TH})\}}{UO \cdot C_{OX}} \cdot (L - 2 \cdot LD) + 2 \cdot LD \cdot R_{SHLDD}}{W_{eff} \cdot \left(V_{GS} - V_{TH} - \frac{1}{2} \cdot V'_{DS}\right)}$$

Hereinafter, a method of extracting a model parameter by decomposition of actually measured data of an integrated circuit according to the present invention will now be described.

Figure 14:
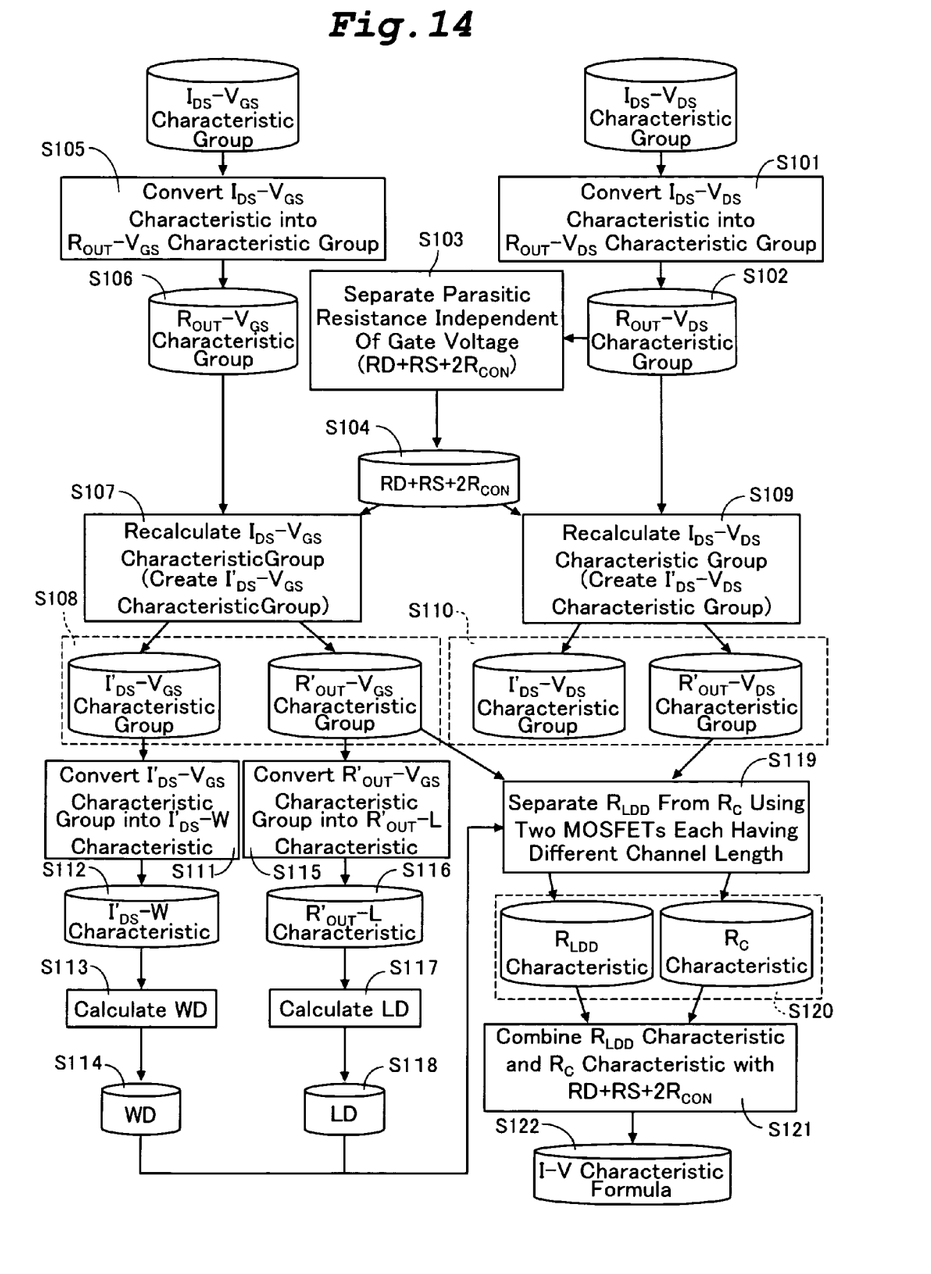
FIG. 14 is a flowchart that shows a method of extracting a model parameter of the MOSFET.

FIG. 14 is a flowchart that shows a method of extracting a model parameter of the MOSFET.

First, a method of calculating parasitic resistance independent of gate voltage of the MOSFET will be described.

By using the $I_{DS}$–$V_{DS}$ characteristic of the MOSFET, an $R_{OUT}$–$V_{DS}$ characteristic is obtained (Step 101), and the $R_{OUT}$–$V_{DS}$ characteristic is then stored (Step 102). Subsequently, by using the $R_{OUT}$–$V_{DS}$ characteristic stored at Step 102, parasitic resistance (2·$R_{CON}$+RD+RS) independent of gate voltage is calculated (Step 103).

From the above formula (12), a term of $R_C$ becomes a straight line in which slope of resistance changes due to the gate voltage $V_{GS}$, and its intersection point becomes the parasitic resistance (2·$R_{CON}$+RD+RS) independent of gate voltage (see FIGS. 4 and 5).

At Step 104, the calculated parasitic resistance (2·$R_{CON}$+RD+RS) independent of gate voltage is stored.

On the other hand, using the $I_{DS}$–$V_{GS}$ characteristic of the MOSFET, an $R_{OUT}$–$V_{GS}$ characteristic is obtained (Step 105), and the $R_{OUT}$–$V_{GS}$ characteristic is then stored (Step 106).

By using the parasitic resistance (2·$R_{CON}$+RD+RS) independent of gate voltage stored as Step 104, the $I_{DS}$–$V_{GS}$ characteristic of the MOSFET is recalculated (Step 107). The recalculated I'$_{DS}$–$V_{GS}$ characteristic and R'$_{OUT}$–$V_{GS}$ characteristic are stored (Step 108).

Further, by using the parasitic resistance (2·$R_{CON}$+RD+RS) independent of gate voltage stored as Step 104, the $I_{DS}$–$V_{DS}$ characteristic of the MOSFET is recalculated (Step 109). The recalculated I'$_{DS}$–$V_{DS}$ characteristic and R'$_{OUT}$–$V_{DS}$ characteristic are stored (Step 110).

Next, a cross-sectional diffusion length (WD) of the MOSFET generated at both ends of the gate width is obtained.

The I'$_{DS}$–$V_{GS}$ characteristic stored at Step 108 is converted into I'$_{DS}$–W characteristic (Step 111), and the I'$_{DS}$–W characteristic is stored (Step 112). Then, using the I'$_{DS}$–W characteristic stored at Step 112 (see FIGS. 7 and 8), the 2 WD is obtained from an intersection point between the X axis and a straight line in which points of the same gate voltage $V_{GS}$ are connected (Step 113). Then, the WD is stored at Step 114.

Next, a length (LD) of the parasitic resistance generated under the both ends of the gate length L is obtained.

The R'$_{OUT}$–$V_{GS}$ characteristic stored at Step 108 is converted into R'$_{OUT}$–L characteristic (Step 115), and the R'$_{OUT}$–W characteristic is stored (Step 116). Then, using the R'$_{OUT}$–W characteristic stored at Step 116 (see FIGS. 10 and 11), the 2 LD is obtained from an intersection point between the X axis and a straight line in which points of the same gate voltage $V_{GS}$ are connected (Step 117). Then, the LD is stored at Step 118.

By using two types of diffusion resistance TEGs in which widths W of the diffusion resistance are the same as each other and lengths L thereof are different from each other, separate the channel resistance ($R_C$) (see the formula (59)) is separated from the parasitic resistance (2·$R_{LDD}$) generated under the both sides of the gate length L (see the formula (60)) (Step 119).

In this regard, since it can be considered that 2·$R_{LDD}$ is sheet resistance ($R_{SHLDD}$) that is inversely proportional to $W_{eff}\cdot(V_{GS}-V_{TH}-½\cdot V'_{DS})$ and proportional to 2·LD, it is expressed as the formula (61).

The $R_{LDD}$ characteristic and the $R_C$ characteristic obtained in this manner are stored (Step 120). Then, the channel resistance under the gate ($R_C$ characteristic), the parasitic resistance dependent upon the gate voltage ($R_{LDD}$ characteristic) and the parasitic resistance independent of the gate voltage (2·$R_{CON}$+RD+RS) are combined (Step 121), and an I-V characteristic formula is obtained (Step 122).

Figure 15:
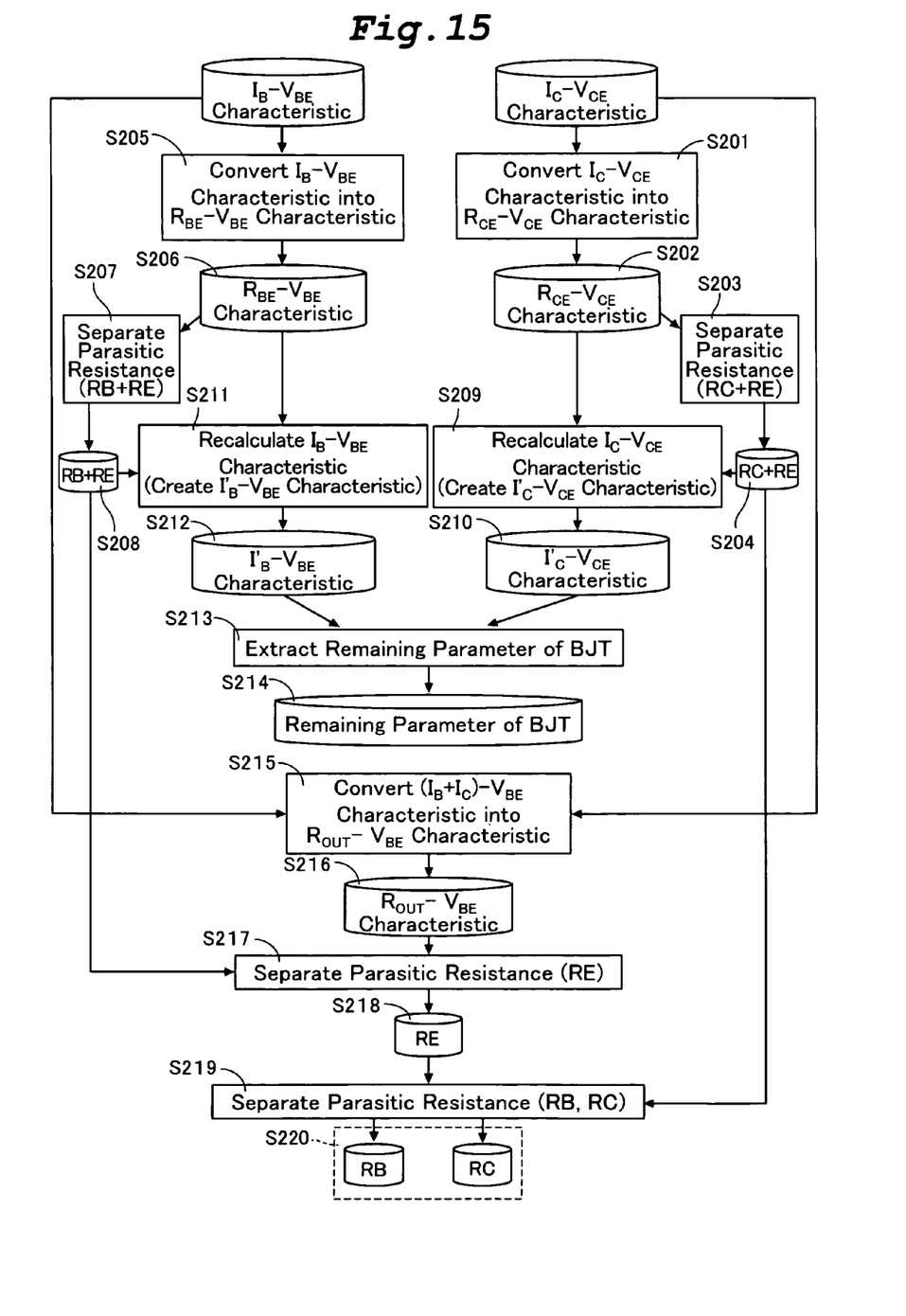
FIG. 15 is a flowchart that shows a method of extracting a model parameter of a BJT (Bipolar Junction Transistor).

FIG. 15 is a flowchart that shows a method of extracting a model parameter of a BJT (Bipolar Junction Transistor).

First, a method of calculating parasitic resistance of the BJT will be described.

An $I_C$–$V_{CE}$ characteristic is converted into an $R_{CE}$–$V_{CE}$ characteristic (Step 201), and the $R_{CE}$–$V_{CE}$ characteristic is then stored (Step 202). By using the $R_{CE}$–$V_{CE}$ characteristic stored at Step 202, parasitic resistance (RC+RE) is calculated (Step 203). Then, at Step 204, the calculated parasitic resistance (RC+RE) is stored.

On the other hand, by using an $I_B$–$V_{BE}$ characteristic of the BJT, an $R_{BE}$–$V_{BE}$ characteristic is obtained (Step 205), and the $R_{BE}$–$V_{BE}$ characteristic is then stored (Step 206). By using the $R_{BE}$–$V_{BE}$ characteristic stored at Step 206, parasitic resistance (RB+RE) is calculated (Step 207). Then, at Step 208, the calculated parasitic resistance (RB+RE) is stored.

By using the parasitic resistance (RC+RE) stored as Step 204, the $I_C$-$V_{CE}$ characteristic of the BJT is recalculated (Step 209). The recalculated $I_C$-$V_{CE}$ characteristic is stored as an $I'_C$-$V_{CE}$ characteristic (Step 210).

Further, by using the parasitic resistance (RB+RE) stored as Step 208, the $I_B$-$V_{BE}$ characteristic of the BJT is recalculated (Step 211). The recalculated $I_B$-$V_{BE}$ characteristic is stored as an $I'_B$-$V_{BE}$ characteristic (Step 212).

Remaining parameter(s) of the BJT is extracted from the $I'_C$-$V_{CE}$ characteristic stored at Step 210 and the $I'_B$-$V_{BE}$ characteristic stored at Step 212 (Step 213). The parameter(s) extracted at Step 213 is stored (Step 214).

Further, by using the $I_C$-$V_{CE}$ characteristic and the $I_B$-$V_{BE}$ characteristic of the BJT, an $(I_B+I_C)$-$V_{BE}$ characteristic is converted into an $R_{OUT}$-$V_{BE}$ characteristic (Step 215). The converted $R_{OUT}$-$V_{BE}$ characteristic is stored (Step 216), and parasitic resistance (RE) is separated using the $R_{OUT}$-$V_{BE}$ characteristic (Step 217). The separated parasitic resistance (RE) is stored (Step 218).

By using the parasitic resistance (RC+RE) stored at Step 204, the parasitic resistance (RB+RE) stored at Step 208, and the parasitic resistance (RB) stored at Step 218, the parasitic resistance (RB, RC) is separated (Step 219), and each of the separated parasitic resistance (RB) and parasitic resistance (RE) is stored (Step 220).

Then, the multiple types of parasitic resistance obtained in this manner are combined to obtain a characteristic formula.

Figure 16:
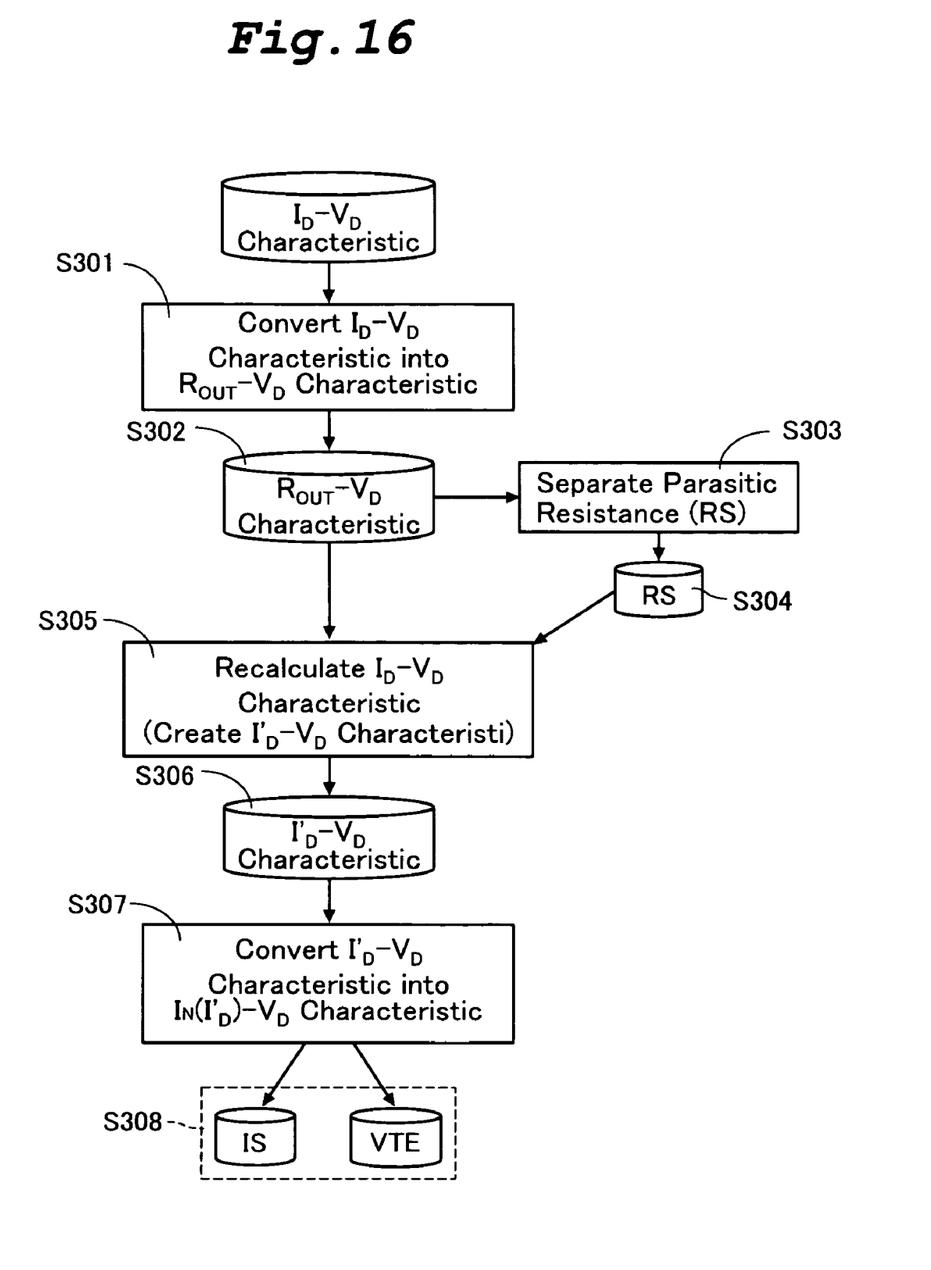
FIG. 16 is a flowchart that shows a method of extracting a model parameter of a diode.

FIG. 16 is a flowchart that shows a method of extracting a model parameter of a diode.

First, a method of calculating parasitic resistance of the diode will be described.

An $I_D$-$V_D$ characteristic of the diode is converted into an $R_{OUT}$-$V_D$ characteristic (Step 301), and the $R_{OUT}$-$V_D$ characteristic is then stored (Step 302). Subsequently, by using the $R_{OUT}$-$V_D$ characteristic stored at Step 302, parasitic resistance (RS) is calculated (Step 303). Then, at Step 304, the calculated parasitic resistance (RS) is stored.

By using the parasitic resistance (RS) stored as Step 304, the $I_D$-$V_D$ characteristic of the diode is recalculated (Step 305). The recalculated $I_D$-$V_D$ characteristic is stored as an $I'_D$-$V_D$ characteristic (Step 306).

Subsequently, the $I'_D$-$V_D$ characteristic stored at Step 306 is converted into $I_N(I'_D)$-$V_{DS}$ characteristic (Step 307). Parasitic resistance (IS) and parasitic resistance (VTE) are separated from the converted $I_N(I'_D)$-$V_{DS}$ characteristic and stored (Step 308).

Then, the multiple types of parasitic resistance obtained in this manner are combined to obtain a characteristic formula.

Figure 17:
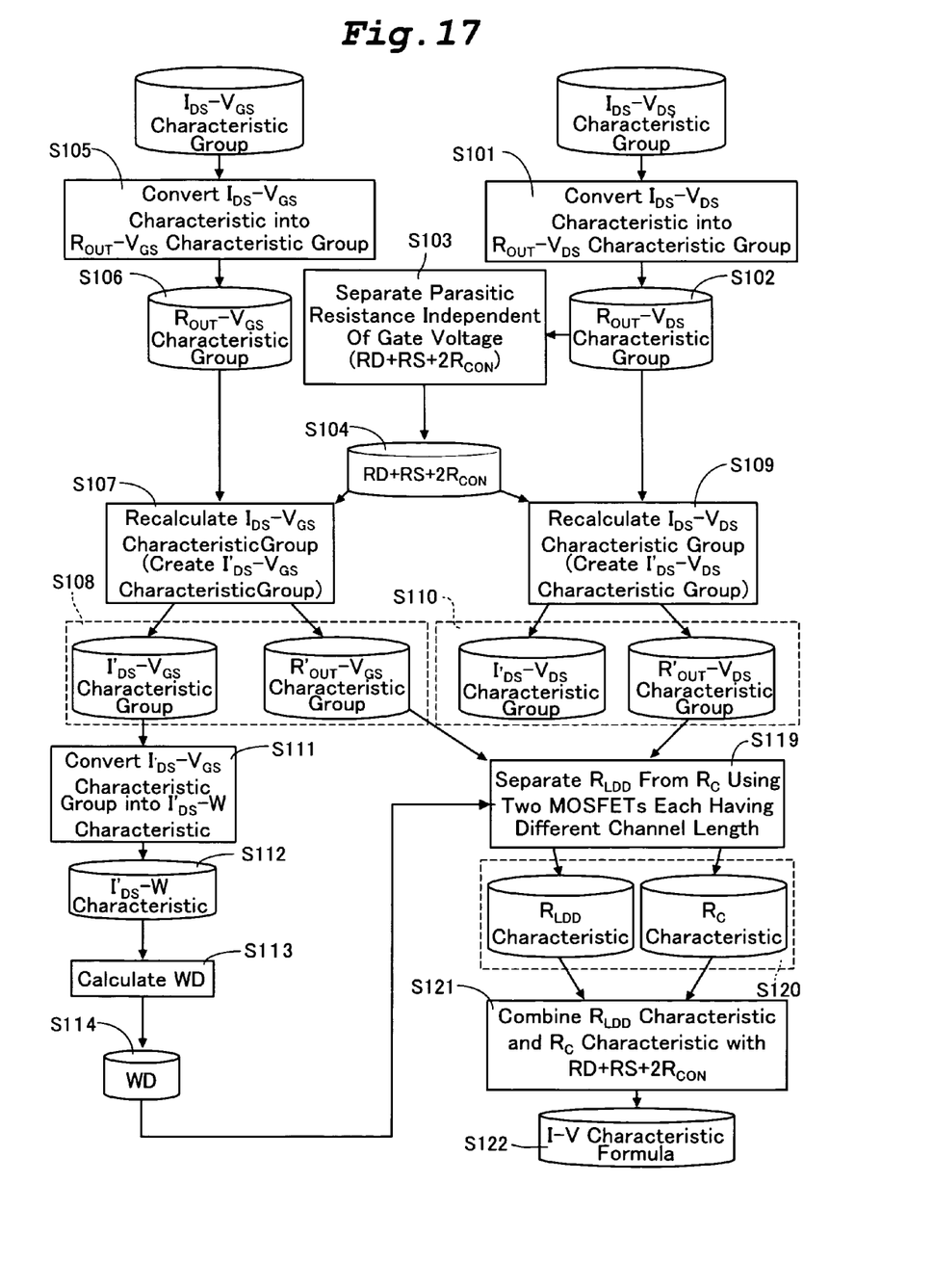
FIG. 17 is a flowchart that shows a method of extracting a model parameter of a JFET (Junction Field-Effect Transistor).

FIG. 17 is a flowchart that shows a method of extracting a model parameter of a JFET (Junction Field-Effect Transistor)

In this regard, since a method of extracting a model parameter of a JFET is the similar to that of the MOSFET, steps same as those in FIG. 14 are assigned to the same reference numerals, and description thereof is omitted.

INDUSTRIAL APPLICABILITY

The present invention relates to a method of calculating a model formula for circuit simulation in which a model formula to be installed in the circuit simulator is obtained by extracting a model parameter by means of decomposition technique of actually measured data, and using the model parameter. The present invention can be applied to semiconductor devices such as a MOSFET, a JFET, a BJT and a diode.

What is claimed is:

1. A method of calculating a model formuala for circuit simulation of a semiconductor device comprising a source, a drain, and a gate having a length L, the method comprising:

calculating first parasitic resistance independent of gate voltage using actually measured data of the semiconductor device;

calculating second parasitic resistance dependent on the gate voltage using IV characteristic of the semiconductor device from which the first parasitic resistance is removed;

dividing the second parasitic resistance into channel resistance and third parasitic resistance generated under both ends of a gate length using plural kinds of diffusion resistance TEG in which the width W of each kind of diffusion resistance is the same as each other, but the length L of each kind of diffusion resistance is different from the other kinds of diffusion resistance; and obtaining an I-V characteristic formula for the semiconductor device using the third parasitic resistance as an independent characteristic;

wherein the first parasitic resistance is equal to $2 \cdot R_{CON}$+RD+RS, the second parasitic resistance is equal to $2 \cdot R_{LDD}$+$R_C$, and the third parasitic resistance is equal to $2 \cdot R_{LDD}$, where $R_{CON}$ is the contact resistance of a drain end or the contact resistance of a source end, RD is the drain diffusion resistance, RS is the source diffusion resistance, $R_C$ is the channel resistance under the gate, and $R_{LDD}$ is the parasitic resistance generated under both ends of the gate length L; and simulating the circuit of the semiconductor device using the model formula calculated by the method.

2. The method according to claim 1, wherein the semiconductor device is a MOSFET, and wherein the method comprises:

calculating the formula (1) as described below from an $I'_{DS}$-$V_{GS}$ Characteristic from which parasitic resistance ($2 \cdot R_{CON}$+RD+RS) independent of the gate voltage, in the case where voltage between drain and source is defined $V_{DS}$, current flowing in a channel is defined as $I_{DS}$, resistance between the drain and the source is defined as $R_{OUT}$, contact resistance of a drain end and a source end is defined as $R_{CON}$, drain diffusion resistance is defined as RD, source diffusion resistance is defined as RS, LLD resistance under the gate is defined as $R_{LDD}$, and $R_C$; channel resistance under the gate is defined as $$Rout = \frac{\{1 + \theta \cdot (V_{GS} - V_{TH})\}}{UO \cdot C_{OX} \cdot W_{\it eff} \cdot \left(V_{GS} - V_{TH} - \frac{1}{2} \cdot V'_{DS}\right)} \cdot \qquad (1)$$

$$\left\{(L - 2 \cdot LD) + \frac{\mu_S}{V\mathrm{MAX}} \cdot V'_{DS}\right\}$$

calculating the formula (2) as described below from a formula ($R_{OUT}1=2 \cdot R_{LDD}+R_C1+RS$), a formula ($R_{OUT}2=2 \cdot R_{LDD}+R_C2+RS$), the $R_{OUT}$, $R_{OUT}1$, and $R_{OUT}2$, in the case where output resistance of a gate length L1 is defined as $R_{OUT}1$ and output resistance of a gate length L2 is defined as $R_{OUT}2$ as the diffusion resistance TEG; and $$\frac{Rout1 - Rout2}{L_1 - L_2} = \frac{\{1 + \theta \cdot (V_{GS} - V_{TH})\}}{UO \cdot C_{OX} \cdot W_{\text{eff}} \cdot \left(V_{GS} - V_{TH} - \frac{1}{2} \cdot V'_{DS}\right)} \quad (2)$$

determining the formula (3) as described below as the third parasitic resistance $2 \cdot R_{LDD}$ generated under the both ends of the gate length L using the $R_{OUT}1$ and the $R_{OUT}2$;

$$\frac{1}{C_{OX} \cdot W_{\text{eff}} \cdot \left(V_{GS} - V_{TH} - \frac{1}{2} \cdot V'_{DS}\right)} \cdot \frac{V'_{DS}}{V\text{Max}}. \quad (3)$$

3. The method according to claim 1, wherein the semiconductor device is a MOSFET, and
wherein, in the case where voltage between drain and source is defined as $V_{DS}$, current flowing a channel is defined as $I_{DS}$, resistance between the drain and the source is defined as $R_{OUT}$, contact resistance of a drain end and a source end is defined $R_{CON}$, drain diffusion resistance is defined as RD, source diffusion resistance is defined as RS, and X and Y axes are defined as $V_{DS}$ and $R_{OUT}$, the whole error is calculated using the formula (4) as described below from an error between a line through a coordinate point (0, b) and a coordinate point $(X, Y_1)$ provided higher voltage side than the $V_{DS}$ and coordinate points $(x_1, Y_{11})$, $(x_2, Y_{21})$ and Λ, and an error between a line through a coordinate point (0, b) and a coordinate point $(X, Y_1)$ provided higher voltage side than the $V_{DS}$ and coordinate points $(x_1, y_{12})$, $(x_2, Y_{22})$ and Λ (in the case where $(Y_1-b)$ in a certain coordinate point is a predetermined value or more, such a certain coordinate point is removed from the coordinate points), and "b" of the coordinate point (0, b) when the whole error becomes the smallest value is determined as parasitic resistance $(2 \cdot R_{CON}+RD+RS)$ independent of to gate voltage;

$$\sum_{j=1}^{m} \sum_{i=1}^{n} \left\{ y_{ij} - \left( \frac{Y_j - b}{X} \cdot x_i + b \right) \right\}. \quad (4)$$

4. The method according to claim 1, wherein the semiconductor device includes a JFET, a BJT and a diode.

* * * * *